United States Patent

[19]

Chang et al.

[11] Patent Number: 5,901,063

[45] Date of Patent: May 4, 1999

[54] SYSTEM AND METHOD FOR EXTRACTING PARASITIC IMPEDANCE FROM AN INTEGRATED CIRCUIT LAYOUT

[75] Inventors: Keh-Jeng Chang, San Jose; Douglas Kaufman, Menlo Park; Martin Walker, Woodside, all of Calif.

[73] Assignee: Frequency Technology, Inc., San Jose, Calif.

[21] Appl. No.: 08/804,524

[22] Filed: Feb. 21, 1997

[51] Int. Cl.$^6$ .................................................. G06F 17/50
[52] U.S. Cl. ........................................ 364/488; 364/578
[58] Field of Search .................................. 364/578, 488, 364/489, 490

[56] References Cited

U.S. PATENT DOCUMENTS

| | | | |
|---|---|---|---|
| 5,031,111 | 7/1991 | Chao et al. | 364/491 |
| 5,081,602 | 1/1992 | Glover | 364/578 |
| 5,305,229 | 4/1994 | Dhar | 364/489 |
| 5,359,534 | 10/1994 | Fujiki et al. | 364/489 |
| 5,452,224 | 9/1995 | Smith, Jr. et al. | 364/488 |
| 5,461,579 | 10/1995 | Misheloff et al. | 364/491 |
| 5,659,483 | 8/1997 | Rhodes et al. | 364/490 |
| 5,706,206 | 1/1998 | Hammer et al. | 364/490 |
| 5,706,477 | 1/1998 | Goto | 364/488 |
| 5,761,080 | 6/1998 | DeCamp et al. | 364/490 |
| 5,787,268 | 7/1998 | Sugiyama et al. | 364/489 |

OTHER PUBLICATIONS

Narain D. Arora, etc.:"Modeling and Extraction of Interconnect Capacitances for Multilayer VLSI Circuits", IEEE Transactions on Computer–Aided Design of Integrated Circuits, vol. 15, No. 1 Jan. 1996, pp. 58–67.

Keh–Jeng Chang, etc., "Parameterized SPICE Subcircuits for Multilevel Interconnect Modeling and Simulation", IEEE Transactions on Circuits and Systems, vol. 39, No. 11, Nov. 1992, pp. 779–789.

Keh–Jeng Chang, etc., "HIVE: An Efficient Interconnect Capacitance Extractor to Support Submicron Multilevel Interconnect Designs", ACM/IEEE Proceedings of ICCAD, Nov. 1991, 4 pages.

Keh–Jeng Chang, etc., "Nondestructive Multilevel Interconnect Parameter Characterization for High–performance Manufacturable VLSI Technologies", IEEE Symposium VLSI Technology, 1993, pp. 135–136.

E. Chang, etc., "Using a Statistical Metrology Framework to Identify Systematic and Random Sources of Die–and Wafer–level ILD Thickness Variation in CMP Processes", IEEE, 1995, pp. 95–499.

G. C. Schwartz, etc., "The Effective Dielectric Constant of Silicon Dioxides Deposited in the Spaces Between Adjacent Conductors", J. Electrochem. Soc., vol. 139, No. 12, Dec. 1992, pp. L118–122.

C. Yu, T. Manug, etc., "Use of Short–Loop Electrical Measurements for Yield Improvement", IEEE Trans. Semi. Manu., vol. 8, No. 2, May 1995, pp. 150–159.

*Primary Examiner*—Vincent N. Trans
*Attorney, Agent, or Firm*—Skjerven, Morrill, MacPherson, Franklin & Friel; Edward C. Kwek

[57] ABSTRACT

A comprehensive system and method allow an integrated circuit designer to extract accurate estimates of parasitic impedances in interconnection lines of an integrated circuit. The method includes collecting values of electrical characteristic parameters to provide a technology profile for a particular fabrication process. An Interconnect Primitive Library builder provides a collection of interconnect 'primitives' that any interconnect structure fabricated under the fabrication process can be broken down into, and combines it with the technology profile for simulations in a 3-dimensional field solver to extract parameterized coupling capacitances and other characteristic impedances for each interconnect primitive. An extraction tool traces a signal path of an integrated circuit and decomposes the interconnect structures on the signal path into interconnect primitives and maps them to the Interconnect Primitive Library. An RC network module provides an RC network based on the characterized parametric values in the mapped interconnect primitives. The RC network thus provided can be used to accurately estimate signal delays in a circuit simulator or delay calculator.

74 Claims, 5 Drawing Sheets

SYSTEM AND METHOD FOR EXTRACTING PARASITIC IMPEDANCE FROM AN INTEGRATED CIRCUIT LAYOUT

BACKGROUND OF THE INVENTION

1. Field of the Invention

The present invention relates to automated tools for integrated circuit design. In particular, the present invention relates to modeling tools for calculating, measuring or predicting electrical characteristics of interconnect wiring in an integrated circuit.

2. Discussion of the Related Art

As integrated circuit ("IC") technology advances, integrated circuits are made at higher integration levels and to run at higher clock speeds. In fact, at sub-micron feature sizes, the signal delay associated with a signal path is dominated by metal interconnections, or "wires", which are used to connect the active devices. For example, in gate-arrays and other routed designs with relatively long wires, the signal delays due to wiring ("wire delays") dominate signal delays between active devices at dimensions just below 1.0 micron. For more densely packed standard-cell designs, wire delays dominate at below 0.6 micron. Unlike the signal delay in the active device itself, which is typically well-characterized, and can be read from a device library, a wire delay depends on the structures in the vicinity of the wire, and thus cannot be modeled or calculated until after all circuit elements associated with the signal path of interest are placed and routed. Often, the accurate modeling of parasitic effects (e.g., parasitic capacitances) associated with these wires are now critical to a successful integrated circuit design.

However, accurate modeling of parasitic impedances of wires is a complex problem, requiring extensive knowledge in the diverse areas of device physics, process technology and electromagnetic field theory. Further, to be of practical value, an accurate model of parasitic impedances must be made both readily available to the integrated circuit designer in his/her normal course of work, and easily incorporated in the integrated circuit under design.

The tasks ("design methodology") of an integrated circuit designer can be summarized by the design flow chart 100 shown in FIG. 1. As shown in FIG. 1, at step 101, the designer uses a high level hardware description language (e.g. Verilog or VHDL) to specify the functional and logic designs of the integrated circuit. Then, at step 102, the logic circuit is synthesized to a logic gate level circuit description, using an automatic logic synthesis tool. Typically, at the next step (i.e., step 103), a preliminary timing analysis on the logic gate level circuit is performed. Upon completing various verification steps (not shown) to ascertain the correctness of the logic gate level circuit and satisfying all timing constraints at the gross level, the physical design step (i.e., step 104) is carried out.

During physical design step 104, which is illustrated in further detail by flow chart 200 of FIG. 2, the logic gate level circuit description of step 102 is provided to a layout design system to be "placed" and "routed" (step 201). Placing is the process by which the logic elements of the logic gate level circuit description are realized in the circuit elements of a physical implementation. Routing is the process by which wires interconnecting the circuit elements of the physical implementation are created. At step 202, estimates of the parasitic impedances of wires in the physical implementation are made ("extracted") to form an interconnect delay model. The estimated parasitic impedances are then used, in step 203, to calculate signal delays resulting from these parasitic impedances. At step 204, a detailed timing analysis is ithen performed to verify that timing requirements are met in the physical implementation. If timing requirements are not met, the integrated circuit designer must return to step 201, i.e., to the layout design step, to make corrective modifications to the layout design In fact, in some instances, the circuit designer may have to return to step 102, where the logic circuit is redesigned such that a circuit implementation meeting timing requirements may be re-synthesized. Steps 202–204 are then repeated as necessary. In designing a high-speed logic circuit, steps 201–204 are typically reiterated many times.

When the design is deemed to have met its timing requirements, the final verification step (i.e., step 105) is performed. In the final verification step, the layout design is checked for compliance with design rules, and an even more extensive timing analysis is also performed.

In the prior art, as the physical circuit elements are interconnected, most place and route systems generate estimates of wire parasitic impedances to be used in subsequent timing simulations. These estimates of parasitic impedances are typically based on a simplistic model which often takes into account only the dimensions of individual wires. The parasitic impedances due to the surrounding structures are compensated for by a conservative "guard band". However, as integrated circuits go to successively higher levels of integration (i.e., smaller sizes and higher circuit densities) and use more layers of conductors, the simplistic model breaks down. In fact, the simplistic model is insufficient to allow accurate analysis of sub-micron designs, especially when estimating parasitic impedances in "critical" nets of the integrated circuit.

For an accurate analysis of parasitic impedances, the Poisson's equation can be solved for the space of interest using a 3-dimensional field solver. However, because both the computation and the input parameters are highly complex, 3-dimensional field solvers are difficult to set up, require a significant amount of computational power, and their results are difficult to use. Typically, to achieve an accuracy that justifies the effort, values of relevant physical parameters of a fabrication process contemplated for implementing the design are required as input data to the 3-dimensional field solver. In addition, because the computation is so complex even for the analysis of a small portion of the integrated circuit, practical solutions require the surrounding wires of a space of interest to be broken up by the user into small segments and be analyzed separately. The user must then collect and process the separate solutions of each analysis to be used in a subsequent delay calculation. As a result of its the complexity, the 3-dimensional field solver approach cannot be extensively used with an existing design methodology, such as that illustrated in FIGS. 1 and 2.

SUMMARY OF THE INVENTION

The present invention provides accurate RC models of interconnect lines to be used in the calculation of wire delays, without requiring extensive changes to the existing integrated circuit design methodology. The present invention is applicable to the extraction of wire parasitic impedances, and the final verification phase of a design.

A system of the present invention includes (i) a database including values of physical parameters characterizing conductor and dielectric layers fabricated in a fabrication process; (ii) an interconnect primitive library organized according to a set of interconnect primitives, such that an interconnect structure fabricated under a given fabrication process maps into one of said interconnect primitives, the interconnect primitive library including, for each of the interconnect primitives, parameterized data of parasitic impedances, based on the values of the physical parameters; and (iii) a network extraction tool for analyzing structures within a predetermined distance in conductor layers of an integrated circuit in vicinities along a signal path of the integrated circuit. The network extraction tool maps the structures to the interconnect primitives of the interconnect primitive library to provide an electrical network model of the signal path, based on the mapping and the values of the parameterized data.

In the system summarized above, each interconnect primitive represents a capacitance coupling between a structure in one of the conductor layers and a structure in the signal path. Further, the network extraction tool divides the structures into change areas, each change area representing a change in dimension in one of the structures. In one embodiment, the network extraction tool divides the signal path into a right portion and a left portion along a direction of signal propagation in the signal path, so that the structures in the right portion are analyzed independently of structures in the left portion.

In one embodiment, the network extraction tool proceeds to analyze, or decompose, the surrounding structures a conductor layer at a time, in the order of increasing distance between the layer under consideration and the structures in the signal path, taking into account shielding effects of conductor layers already analyzed. Shielding effects arising from capacitance coupling between the structure in the conductor layer of the signal path and the structures in conductor layers on the same side of the conductor layer under consideration are handled separately from shielding effects arising from capacitance coupling between the structure in the conductor layer of the signal path and structures in conductor layers on opposite sides with the conductor layer under consideration.

In one embodiment, each interconnect primitive is identified by the conductor layers to which the interconnect primitive pertains. In the electrical network model provided, a via is represented by a resistor. Other elements include (i) capacitors each representing capacitance between a portion of a wire in the signal path and neighboring wires in the same conductor layer; (ii) capacitors each representing the capacitance between the portion of the wire in the signal path and an edge of a conductor in another conductor layer; (iii) capacitors each representing a capacitance between the portion of the wire in the signal path and the substrate; and (iv) capacitors each representing the capacitance between the portion of the wire in the signal path and one or more faces of a conductor in another conductor layer. The parametric values used to estimate these capacitors may be different depending upon whether the faces are oriented towards or away from the wire in the signal path. In this embodiment, important parameters in estimating the capacitance in these capacitors are the dimensions of the wire in the signal path and the distance separating the wire and the nearest wire in the same conductor layer.

In one embodiment, the capacitance between a portion of a wire in the signal path and various portions of a cross-over wire in another conductor layer are separately analyzed according to how far each portion of the cross-over wire is away from the wire in the signal path. Accordingly, the space surrounding the wire in the signal path is divided into nonoverlapping "bins" Each portion of the cross-over wire is analyzed according to which of the bins the portion of the cross-over wire falls into. In that embodiment, the interconnect primitives are provided as data points of a series of parameterized curves. To estimate a coupling capacitance not falling on those data points, interpolation techniques are used. One method for obtaining the parameterized curves of the interconnect primitive library uses the values of said physical parameters in an electric field distribution solver, which solves the Poisson's equation for electric fields.

As can be seen above, a method of the present invention includes a pre-calculation component and a run-time component. The pre-calculation component, which is used to characterize parasitic impedances in circuits created under a given fabrication process, includes the steps of: (a) identifying a set of interconnect 'primitives' into which any interconnect structure can be broken down; (b) for each interconnect primitive, using process parameters specific to the fabrication process as input data to a series of field solver simulations, so as to determine the impedance associated with each interconnect primitive; and c) storing the impedances associated with the interconnect primitives thus obtained into an "interconnect primitive library".

The run-time component, which is used to estimate parasitic impedances for a given integrated circuit to be fabricated under the fabrication process, includes the steps of: (a) analyzing the layout of the integrated circuit, so as to decompose the interconnect structures along a signal path and create a mapping between the interconnect structures and corresponding interconnect primitives in the interconnect primitive library;(b) retrieving from the interconnect primitive library the stored impedance associated with the mapped interconnect primitives, and (c) based on the stored impedance associated with the mapped interconnect primitives, generating network elements representative of the electrical behavior of the decomposed interconnect structures.

The present invention is better understood upon consideration of the detailed description below and the accompanying drawings.

DETAILED DESCRIPTION OF THE PREFERRED EMBODIMENTS

The present invention provides a comprehensive system for generating accurate RC models for interconnect lines. These RC models can then be used to calculate wire signal delays with the requisite accuracy needed in analyzing sub-micron designs, without requiring the use of a complex 3-dimensional field solver on the interconnect lines.

Figure 1:
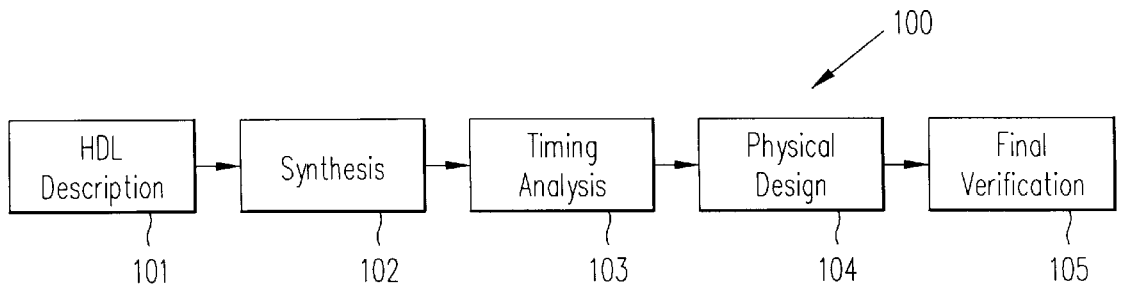
FIG. 1 is a flow chart 100 showing the tasks of an integrated circuit designer.
Figure 2:
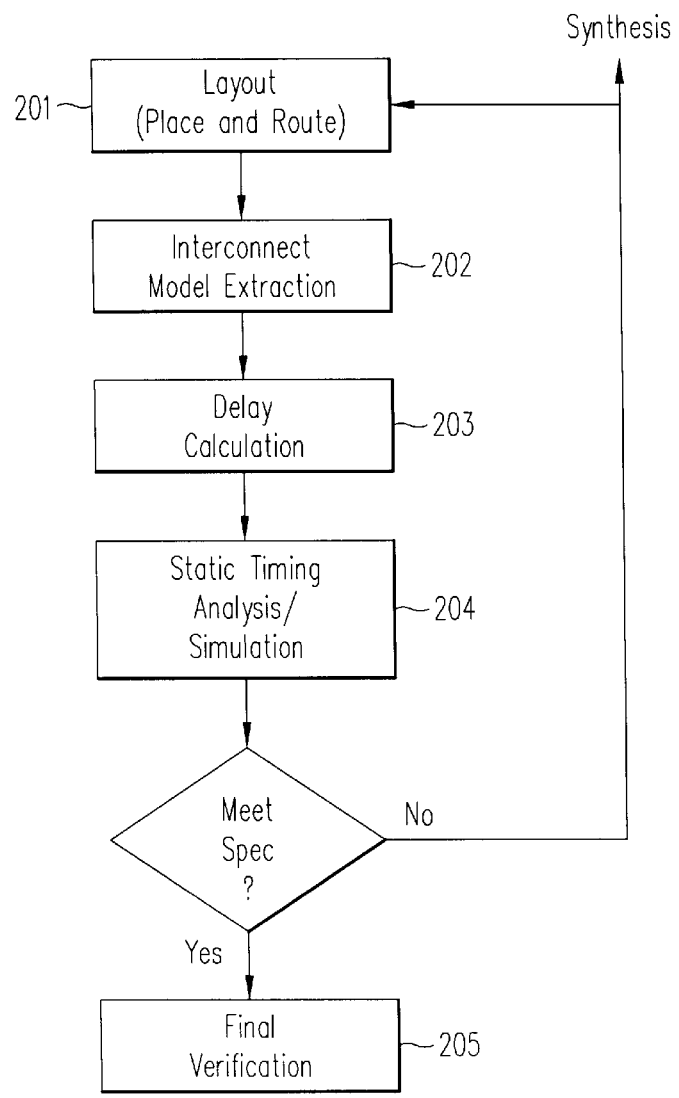
FIG. 2 is a flow chart 200 further illustrating the physical design step 104 of FIG. 1.
Figure 3:
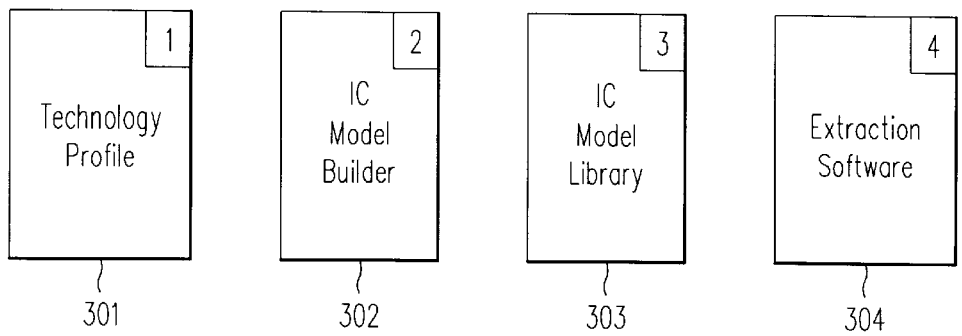
FIG. 3 provides an overview of system 300 in an embodiment of the present invention.

FIG. 3 provides an overview of system 300 in one embodiment of the present invention. As shown in FIG. 3, system 300 includes components subsystems 301–304. Subsystems 301–303 form a pre-calculation portion in a method of the present invention. In addition, subsystems 303–304 form a run-time portion in a method of the present invention. Subsystem 301, which is referred to as the "technology profile", contains empirical data ("process data") for characterizing the material and electrical properties of conductor and insulator layers fabricated in a given integrated circuit fabrication process. The technology profile is specific to the fabrication process. The empirical data in the technology profile is typically supplied by the manufacturing facility ("fab"), having been extracted from various tests and measurements actually conducted in the fab.

Subsystem 302, which is known as the "IC model builder," combines the process data obtained in subsystem 301 with a database of "interconnect primitives". These interconnect primitives represent basic components of interconnect structures into which any interconnect wire structure can be broken down. For a given fabrication process, the parasitic impedances associated with some interconnect primitives can be extracted from one or more test structures fabricated under the fabrication process. The parasitic impedances associated with each interconnect primitive can also be calculated a field solver or a capacitance extraction program using process data of the technology profile. Examples of suitable field solvers or capacitance extraction software programs include "Raphael", which can be obtained from Technology Modeling Associates, of Sunnyvale, California and "QuickCAP," which can be obtained from Random Logic Corporation of Richmond, Virginia. The impedance values reported by the field solver are stored in an "IC model library" (subsystem 303). After the requisite number of field solver runs, which may number in the tens of thousands for each process, the impedance values reported by the field solvers are represented in the IC model library by a set of data tables, which constitute a set of 'parameterized' curves for each interconnect primitive. These parameterized curves can be scaled and interpolated to predict the impedance of an interconnect structure which is mapped into the interconnect primitive, with a minimal loss of accuracy. As described below, during the design process, actual interconnect structures are decomposed and mapped into the interconnect primitives of IC model library subsystem 303. The interconnect primitives and their associated impedances in the IC model library subsystem 303 are used to estimate the parasitic impedances of the decomposed interconnect structures. A more detailed discussion of the use of IC model library subsystem 303 is provided below.

Figure 4:
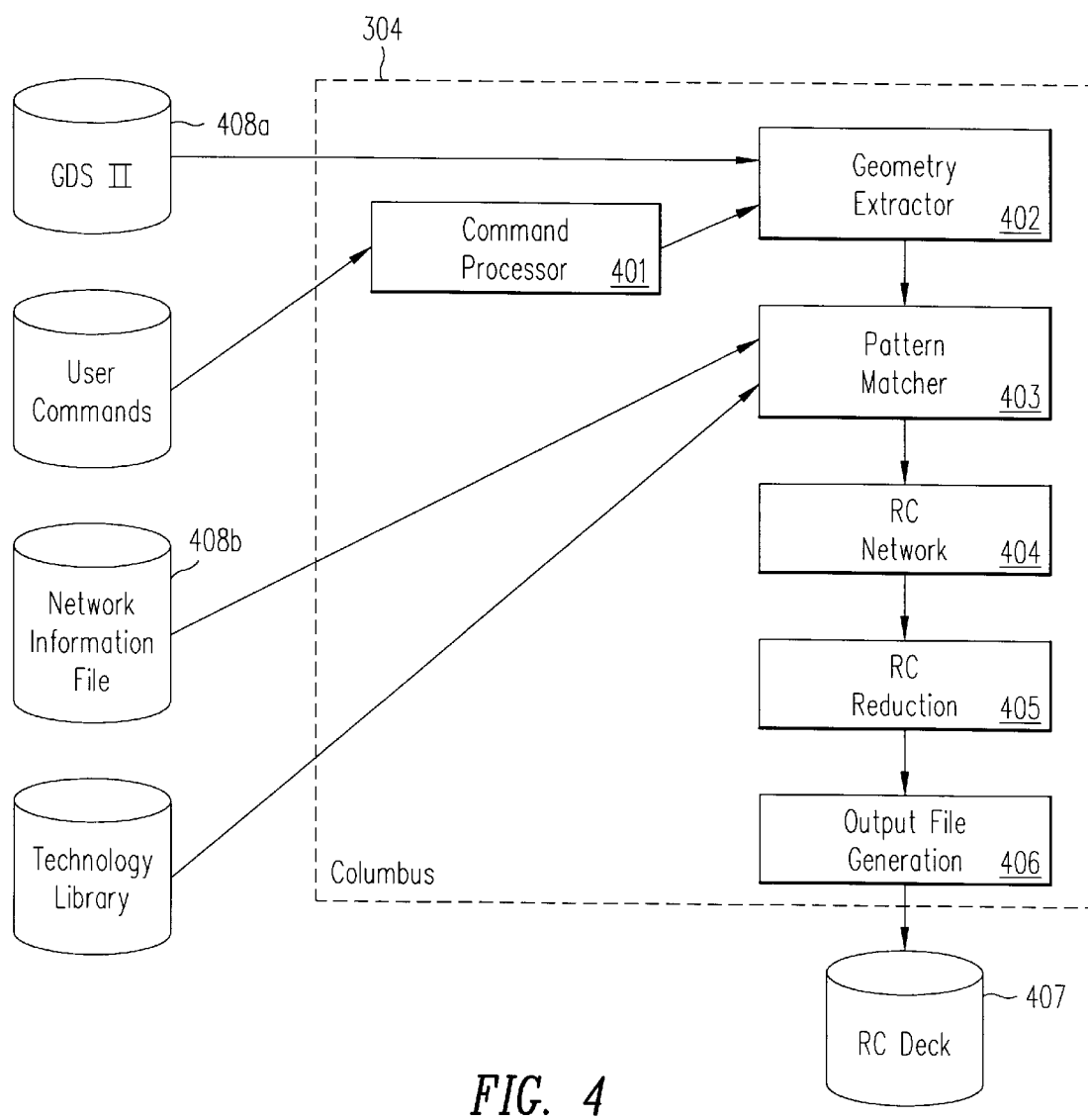
FIG. 4 is a block diagram of Columbus subsystem 304.

The extraction subsystem 304, also called "Columbus", decomposes for analysis the physical interconnect structures along a signal path. The decomposed structures are then mapped into the interconnect primitives of IC model library subsystem 303. The interconnect primitives and their associated impedances are used to provide an RC circuit model for the decomposed interconnect structures. Such an RC model can then be used in a circuit simulator to obtain accurate signal delays FIG. 4 is a block diagram of Columbus subsystem 304. Columbus subsystem 304 provides a command processor 401 as a user interface Columbus subsystem 304 receives as input data (a) a physical design file (labeled 408a in FIG. 4), which is typically represented in the GDS II format, (b) a network information file (labeled 408b in FIG. 4), and (c) a layer mapping file which provides a link between GDS II layer numbers and known layer names. The GDS II format is familiar to those skilled in the art. When Columbus system 304 receives a physical design, a geometry extractor module 402 reorganizes the physical geometries represented in the GDSII data into a database that is optimized for quick access. In the present embodiment, to minimize the memory required by Columbus system 304, and to allow quick access, this database is stored in a number of temporary files which are brought into memory as needed.

Once the IC model library subsystem 303 and the physical design file 408a are accessed by Columbus subsystem 304, and organized in the database discussed above, Columbus system 304 begins analysis of individual signal paths ("nets"). The user can specify through command processor 401 any or all nets specified in physical design file 408a. Nets are identified by the names specified in network information file 408b.

Geometry extractor module 402 traces a given net through the integrated circuit's layout representation in physical design file 408a. Geometry extractor module 402 can trace nets in one of two modes: (i) "trace-to-transistor" mode, and (ii) "trace-to-pin" mode. In "trace-to-transistor" mode, geometry extractor module 402 traces all polygons that are electrically connected to the traced net, until a transistor is encountered. In "trace-to-pin" mode, geometry extractor module 402 traces through polygons of the net until one of the net's specified pins, which are typically located at low level macro cell boundaries, is encountered. Pin names and locations are provided in network information file 408b.

When analyzing the coupling effects of neighboring interconnect structures in a sub-micron design, only interconnect structures within a certain "concern distance" of the net being traced need to be analyzed. This concern distance is process-specific, and depends upon the conductor layers of the net being analyzed. As geometry extractor module 402 traces a wire along the signal propagation direction, the relevant surrounding interconnect structures for the analysis are encompassed in a logical "tunnel" centered at the wire and extending to the "concern distance". Only conductor structures having at least a portion found within the space of the logical tunnel are considered to contribute to the coupling capacitances of the net being analyzed.

Once geometry extractor module 402 has traced a net and identified the relevant surrounding interconnect structures, the wire (and the surrounding interconnect structures) are fractured into a collection of 3-dimensional sections ("change areas"). A change area is established whenever a change is found in the geometry of the wire, e.g., a change in width, or a change in the geometry of any neighboring conductor within the surrounding interconnect structures.

In the present embodiment, for each change area of the wire being analyzed (the "present wire"), Columbus system 304 computes in pattern matcher module 403 the following: (a) a series resistance for the wire segment of the present wire in the change area, based on the wire segment's dimensions within the change area and the resistivity of the wire segment's specific constituent material, as provided in IC model library subsystem 303; (b) a capacitance coupling the wire segment to the ground reference (substrate); (c) a coupling capacitance, inclusive of parallel plate and fringing capacitances, coupling the wire segment to the nearest parallel wire on the same conductor layer as the present wire; (d) coupling capacitances, inclusive of parallel polate and fringing capacitances, each coupling the wire segment to interconnect structures within the logical tunnel in a neighboring conductor layer; and (e) via resistances. In computing via resistances, the resistance of each via is provided in IC model library subsystem 303. If the wire segment is associated with multiple vias, e.g., vias grouped together in a "via farm", the vias resistances are combined in parallel to provide a single via resistance for the change area.

Figure 9:
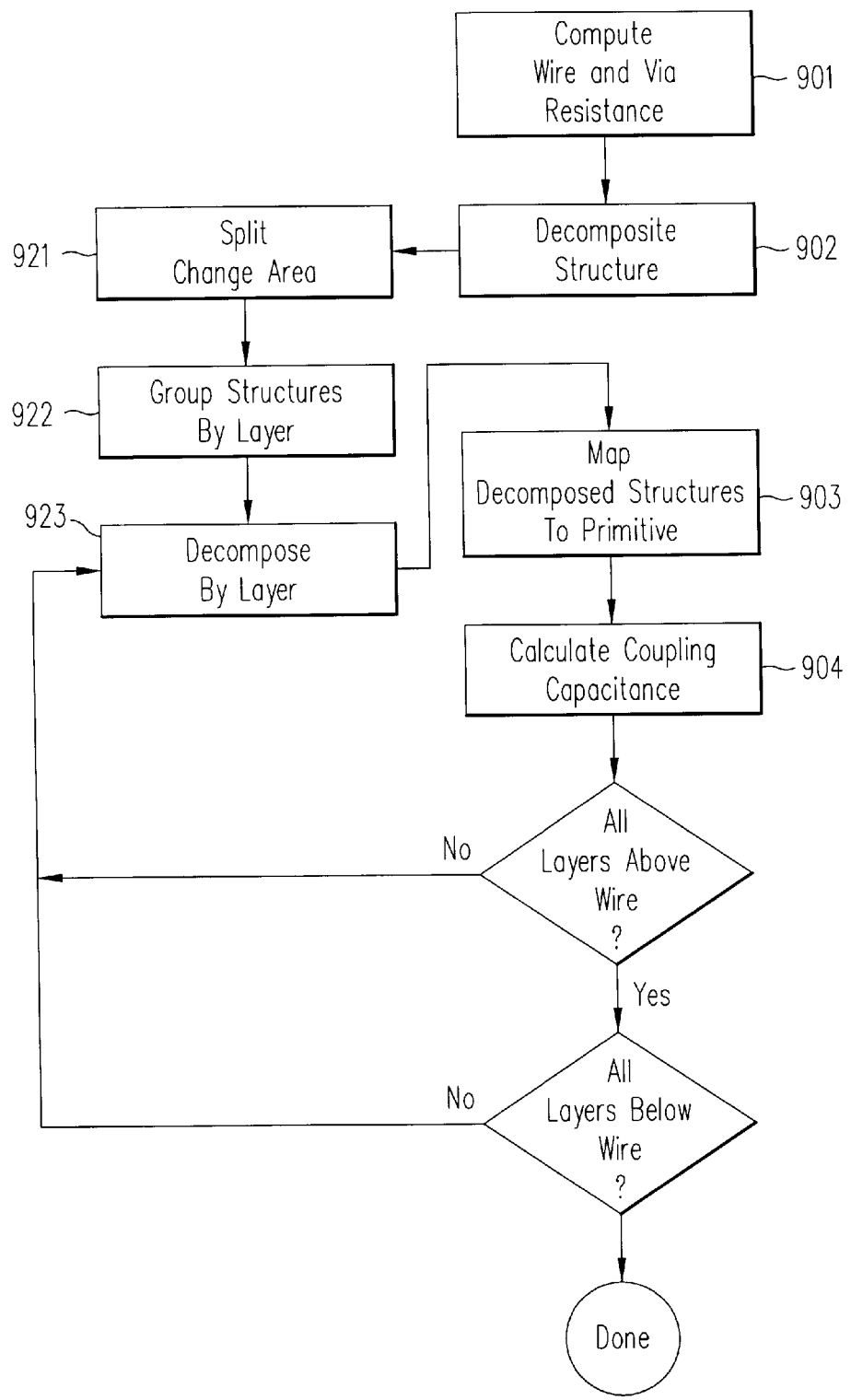
FIG. 9 is a flow chart illustrating the operation of pattern matcher module 403.

The operation of pattern matcher module 403 is explained in conjunction with the flow chart 900 shown in FIG. 9. The wire segment's resistance and any associated via resistance are first computed (step 901). Then, pattern matcher module 403 computes the coupling capacitances of the surrounding structures (i.e., interconnect structures not on the same conductor layer as the wire segment). To compute the coupling capacitances, pattern matcher module 403 decomposes the structures of surrounding conductors at step 902. Step 902 is further illustrated by steps 921–923 in FIG. 9. In the decomposition step 902, pattern matcher module 403 first splits the change area into a left side and a right side along the signal propagation direction (step 921). Since the coupling of structures on the left and right sides are considered reasonably independent of each other, in each change area, pattern matcher module 403 can treat decomposed structures on the left and right sides independently of each other. Next, at step 922, pattern matcher module 403 groups neighboring structures according to their respective conductor layers. At step 923, pattern matcher module 403 selects a conductor layer and its associated structures for processing in subsequent steps 903 and 904, beginning with structures of the conductor layer directly above the conductor layer containing the present wire segment. For each selected conductor layer, at step 903, pattern matcher module 403 maps the decomposed structures into interconnect primitives of IC model library subsystem 303. Pattern matcher module 403 then calculates, at step 904, a combination of resistance and capacitance values from the process data associated with the mapped interconnect primitives of the IC model library subsystem 303. Pattern matcher 403 then returns to step 923 to select structures in the next conductor layer above, if any, until all conductor layers above the present wire segment are processed. Steps 923, 903 and 904 are then repeated for all conductor layers below the present wire segment, again starting with the conductor layer directly below the layer containing the present wire segment in order of increasing distance from the present wire segment.

The coupling capacitance values that pattern matcher module 403 computes for a decomposed structure of a particular conductor layer are initially calculated independent of other conductor layers, under a simplifying assumption. To correct for this assumption, pattern matcher module 403 applies two different corrections, or "shielding factors", to account for capacitance effects due to the presence of other conductor layers. The first set of shielding factors ("same-side shielding"), which are applied to coupling capacitance values, account for the presence of structures in conductor layers between the structures in the conductor layer under consideration and the present wire segment For example, while the structures in the conductor layer directly above or below the present wire segment can be considered independent of the conductor layers further away from the present wire segment, structures in a conductor layer two conductor layers away from the present wire segment are physically and electrically shielded by structures in the intervening conductor layer directly above or below the present wire segment. Likewise, structures in conductor layers three layers away from the present wire segment are shielded by the two intervening conductor layers between the present wire segment. Two same-side shielding factors are used: one for compensating shielding by conductor layers above the present wire segment, and the other one for compensating shielding by conductor layers below the present wire segment. In the present implementation, each same-side shielding factor is a simple scaling factor, based upon an estimate of the calculated coupling capacitance as a percentage of a hypothetical maximum possible coupling capacitance between the present wire segment and the conductor layer directly above or below, as the case may be. The hypothetical maximum possible coupling capacitance is provided as a the coupling capacitance between the present wires segment and a sheet of the next conductor layer blanketing the logical tunnel. For calculating the coupling capacitances between the present wire segment and the structures in the conductor layer directly above or below it, the same-side shielding factor is zero, as there is not an intervening conductor layer between such a conductor layer and the present wire segment. Within each change area, the same-side shielding factor seen by each conductor layer is cumulative of the same-side shielding factors seen by conductor layers closer to the present wire segment. Once the same-side shielding factor reaches 100%, structures in conductor layers further away do not contribute to the coupling capacitance estimation.

A second set of shielding factors, consisting of an "above-shielding factor" and a "below-shielding factor", correct for the effects that structures in conductor layers above the present wire segment have on coupling capacitance values to structures in conductor layers below the present wire segment, and vice versa. The above-shielding factor is based on the percentage of the hypothetical maximum capacitance that structures in conductor layers above the present wire segment have accumulated, inclusive of same-side shielding effects. The above-shielding factor is used to look up a correction for each coupling capacitance between the present wire segment and structures in conductor layers below it. Likewise, the "below-shielding" factor is based on the percentage of the maximum capacitance that structures in conductor layers below the present wire segment have accumulated, inclusive of same-side shielding effects. The below-shielding factor is used to look up a correction for each coupling capacitance between the present wire segment and structures in conductor layers above it. The actual values of these corrections are process-specific and are provided as tables in IC model library subsystem 303. These tables, which are derived by 3-dimensional field solver runs, are indexed by the widths of the present wire segment and the spacings to the present wire segment's nearest parallel neighboring wire in the present wire segment's conductor layer. The above-shielding and below-shielding correction values are derived by varying the percentage of maximum coupling to structures above or below a charged line, and solving the effects of the shielding on structures on the opposite side.

In step 904, pattern matcher module 403 also computes on each side, i.e, its right side and its left side, a coupling capacitance between the present wire segment and the nearest parallel wire in the same conductor layer. To compute this coupling capacitance, pattern matcher module 403 locates the nearest structure in the present wire segment's conductor layer and obtains the spacing between the present wire segment and that nearest structure. The shielding effects of the conductor layers above and below the present wire segment are also taken into consideration. The spacing, which is also used to break down and to characterize the structures on other conductor layers, is used to look up capacitance tables in IC model library subsystem 303. As with "above-shielding" and "below-shielding, each table represents data points along the curves relating coupling capacitance to the nearest parallel neighbor (labeled $C_c$) and the percentage of maximum coupling capacitance calculated to structures in conductor layers above and below the present wire segment. Each table can be interpolated to obtain intermediate values between data points. The data contained in the tables are obtained in simulations by a field solver, under various percentages of maximum coupling between a charged line and structures above or below the charged line.

The coupling capacitances between the present wire and each of its neighboring conductor wires are calculated under the assumption that the present wire is statically charged, while all other nets are at ground reference, i.e. the effects of switching are ignored. The greatest switching effect on the coupling capacitance occurs when the present wire and a neighboring net both switch at the same time, but in the opposite directions. To capture this switching effect, the static coupling capacitance between the two nets (i.e., the present wire and the neighboring net) can be estimated by a capacitor to ground reference having twice the static coupling capacitance, according to the "Miller equivalent" model. Thus, when pattern matcher module 403 calculates a coupling capacitance between the present wire segment and another wire, the coupling capacitance is converted to a coupling capacitance between the present wire segment and the ground reference, multiplied by a 'switch factor', which ranges from 1 to 2, depending on whether or not the present wire segment should be assumed to simultaneously switch with a neighboring net. In this embodiment, Columbus system 304 operates in one of three modes: (a) static mode, in which all switch factors are set to 1 (i.e., no nets are switching), (b) switch mode, in which specifically identified nets have switch factors set to 2, and (c) worst-case mode, in which all switch factors, except specifically identified nets (e.g., power and ground), are set to 2. Thus, to run an analysis under Columbus system 304, a user selects through command processor 401 one of the three modes (i.e., static, switch or worst-case) discussed above, and provides the names of the nets to be analyzed, and a list of static or switching nets, as appropriate.

Figure 7:
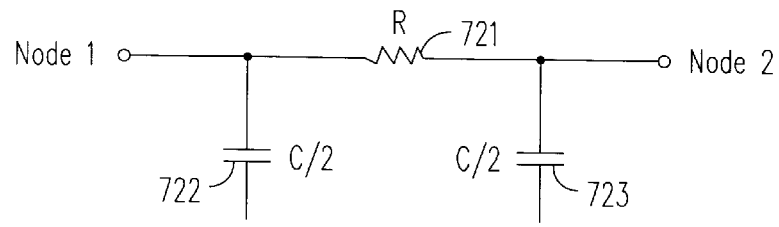
FIG. 7 shows a "π" or "pi" RC network output by RC network module 404 for a regular wire segment.
Figure 8:
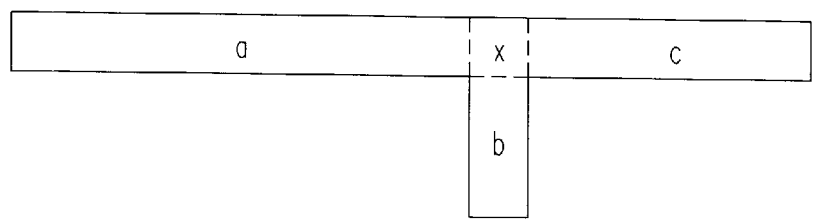
FIG. 8 shows an RC network output by RC network module 404 for a "T" junction.
Figure 8:
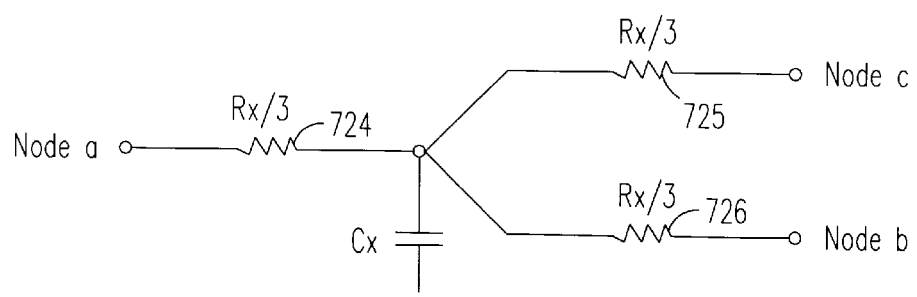

After the present wire is completely analyzed, RC network module 404 combines the resistors and capacitors generated by pattern matcher module 403 for the present wire to form an RC network. This approach creates an independent RC network that accurately models the interconnect net. For each change area, RC network module 404 generates an RC circuit which is configured as a "π" or "pi" structure. FIG. 7 shows a "π" or "pi" RC network output by RC network module 404 for a regular wire segment. As shown in FIG. 7, a resistor corresponding to a wire segment is provided as resistor 721, and all individual coupling capacitances (converted to ground capacitances) are combined and equally split into capacitors 722–723, which are placed at electrical nodes around resistor 721. In the case of a corner or a "T" junction in the present wire segment, RC network module 404 outputs a slightly different network. FIG. 8 shows the output network for a "T" junction. In FIG. 8, the corner resistance is divided into three equal resistances, 724–726. Each of these resistors is connected at a common electrical node coupled to the ground reference by a single capacitor 727 (which represents the combined coupling capacitances for that change area). Each of resistors 724–726 connects to an electrical node in a change area adjacent the "T" junction. When the present wire segment includes a via, the RC network module simply outputs a resistor which contains the via resistance. Coupling capacitances to a via are ignored.

For each net analyzed, RC network module 404 combines the RC networks of all the change areas of the net to provide a full RC netlist model for the net. RC network module 404 includes an RC network reduction module 405, which can be used to reduce the full RC netlist model to provide a reduced RC netlist model, using well-known linear network reduction techniques. The reduced RC netlist model is suitable for obtaining better runtime performance in some delay calculators.

RC network module 404 then invokes output file generation module 406 to write the traced net into file 407, which can be used as an input data file for one of many circuit simulators, such as SPICE and SPF.

In the present embodiment, Columbus system 304 decomposes the wires that surround the present wire into structures that can be mapped into the interconnect primitives, which are characterized by pre-calculated capacitances stored in IC model library subsystem 303.

In physical design file 408a, the surrounding wires are represented by polygons in the vicinity of the present wire segment, which is itself also represented in physical design file 408a by polygons. Each interconnect primitive represents physical components of structures defined by the polygons of the present wire segments and the surrounding wires. Thus, an interconnect primitive is characterized by the combination of the following: (a) the conductor layer containing the present wire segment (the "lba layer"); (b) the conductor layer containing the interconnect primitive (the "neighbor layer"); (c) location of the interconnect primitive relative to the present wire segment ("bin location"); (d) amount of additional other interconnect primitives on the same neighbor layer ("bin factors"); (e) interconnect primitive type (which structural component is being represented); (f) width of the present wire segment ("lba width"); and (g) spacing between the present wire segment and its nearest parallel neighbor in the present wire segment's conductor layer ("spacing").

In IC model library subsystem 303, each interconnect primitive is first identified by a key including two "layer factors" and one or more "bin factors". The layer factors are: (a) the lba layer, and (b) the neighbor layer. For example, if the signal being traced is on metal layer II (i.e., "M2"), and the neighboring layer under consideration is metal I ("M1"), the interconnect primitive to be mapped is characterized by the layer factors M2 and M1.

The bin factors encode, within the present change area, the location of the interconnect primitive itself with respect to the present wire segment and the locations of other polygons in the same neighbor layer. Note that, as discussed above, when calculating bin factors for a particular combination of layer factors, pattern matcher module 403 considers neighboring interconnect primitives on the "right-hand side" and "left-hand side" of the present wire segment independently. On both sides, Bin 1 is the bin closest to the center of the present wire segment. In addition, the number of bins and their sizes are not fixed. If the space of interest is divided into three bins, as in the present embodiment shown in FIG. 5 discussed below, eight bin factor combinations—the values for bin factors (0, 0, 0) are provided for interpolation purposes—are provided for each combination of conductor layers. For each conductor layer, the number of bins and their respective sizes are specified in IC model library subsystem 303. The selection of bin sizes depends upon achieving the desired modeling accuracy for a particular fabrication process. In this embodiment, the bin size is parameterized by the width of the present wire segment. For example, for a wire segment in metal layer M2 of a given fabrication process, IC model library subsystem 303 specifies that the neighboring area of interest is divided into 3 bins, having boundaries at (0.5, 1.0, Max). This notation represents: (a) bin 1, which includes the space between the center of present wire segment to 0.5 times the width of the present wire segment; (b) bin 2, which includes the space from 0.5 times the present wire width to 1.5 times the present wire width; and (c) bin 3, which includes the space from 1.5 times the present wire segment width to a specified maximum ("concern distance") for the M2 layer.

Figure 5:
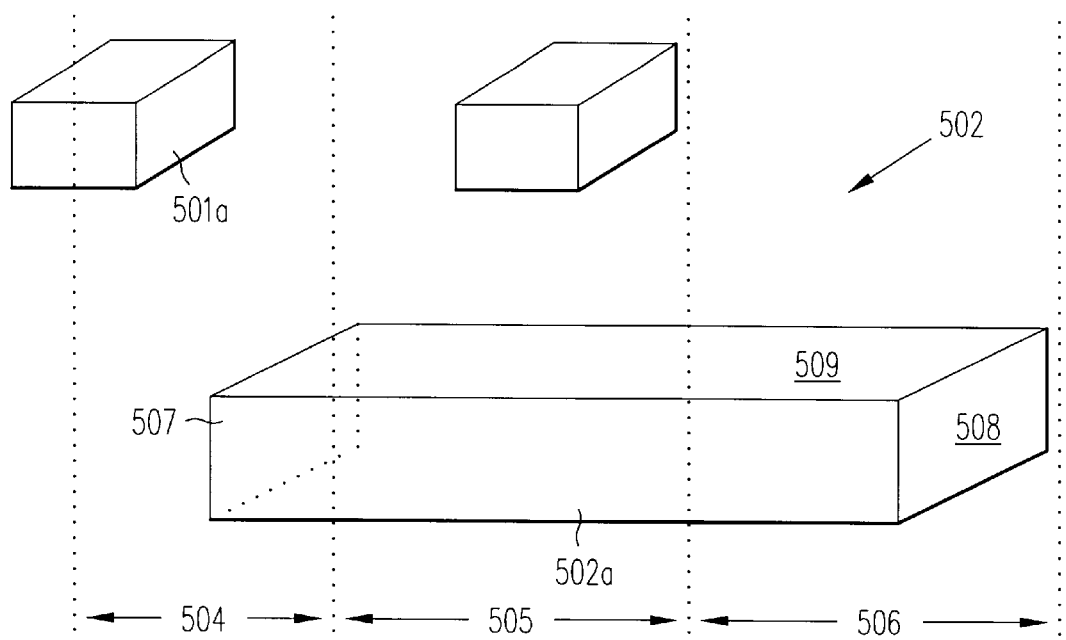
FIG. 5 illustrates the use of bin factors.

FIG. 5 illustrates the use of bin factors. As shown in FIG. 5, the present wire 501a is in conductor layer 501 and a wire 502a is in neighboring layer 502. Wire 502a spans a certain distance in a direction orthogonal to the direction of 501a. In the embodiment shown in FIG. 5, the space surrounding wire 501a is divided into three "bins" 504–506, although the number of bins to use depends upon achieving the desired modeling accuracy for a specific fabrication process. As shown in FIG. 5, wire 502a occupies bin 505 fully, but only fractionally in bins 504 and 506. When considering this neighbor layer, Pattern matcher module 403 assigns, based on the respective occupancies of bins 504–506, bin factors 0.5, 1, and 0.5 (written hereafter "(0.5, 1, 0.5)"). Thus, to map the configuration shown in FIG. 5, pattern matcher module 403 would search in IC model library subsystem 303 for an interconnect primitive having the key (M2, M1, 0.5, 1, 0.5). Of course, due to fractional occupancies, an exact mapping is often unavailable. In such cases, the closest interconnect primitives are used to interpolate the present configuration. In fact, in the present embodiment, interconnect primitives are provided only for normalized bin values of 0 or 1 (i.e., 0 representing no occupancy in the bin, 1 representing 100% occupancy of the bin). Thus, in the configuration shown in FIG. 5, geometry extractor module 402 chooses a number of bounding interconnect primitives, and interpolates the required capacitance values between these bounding interconnect primitives. For example, the coupling capacitance value for primitives with bin factors (0.5, 1, 1) are interpolated from the capacitance values for primitives having bin factors (0, 1, 1) and (1, 1, 1). In this embodiment, interpolation for the bin furthest away from the present wire segment is interpolated using a function that decreases more rapidly than linearly, e.g., 1/x interpolation, and linear interpolation is used in all other bins.

When multiple interpolations between bin factors are needed, as in the configuration of FIG. 5, the interpolations are performed in increasing dominant factor order. That is, the most dominant factor is always interpolated last. The most dominant bin factor (and hence is always last to be interpolated) is the bin which contains the interconnect primitive for which the capacitance is being calculated. The next dominant factor relates to the distance from the present wire segment: i.e., the further away a bin is from the present wire segment, the lesser the dominant factor. For example, if the bin factors are (0.5, 1, 0.5), as in FIG. 5, the first and third bins (i.e., bins 504 and 506 in FIG. 5) are interpolated. When calculating the capacitances between the present wire segment and the interconnect primitives in bin 504, the bin 506 values are interpolated first. That is, capacitances for (a) bin factors (0, 1, 0.5) and (b) bin factors (1, 1, 0.5) are obtained by interpolating the capacitances under (i) bin factors (0, 1, 0) and (0, 1, 1), and (ii) bin factors (1, 1, 0) and (1, 1, 1). The desired capacitances are then derived by interpolating capacitances of the library primitives for bin factors (0, 1, 0.5) and (1, 1, 0.5) thus obtained. Similarly, when calculating the capacitances between the present wire segment and the interconnect primitives in bin 506, the bin 504 values are interpolated first. That is, capacitances for the primitives for (a) bin factors (0.5, 1, 0) and (b) bin factors (0.5, 1, 1) are first obtained by interpolating the capacitances under (a) bin factors (0, 1, 0) and (1, 1, 0), and (b) bin factors (0, 1, 1) and bin factors (1, 1, 1). The desired capacitances are then derived from the primitives for bin factors (0.5, 1, 0) and (0.5, 1, 1) When calculating the capacitances between the present wire segment and interconnect primitives in bin 505, the interpolation order is based solely on the distance from the present wire segment (because bin 505 does not need interpolating). Therefore, the interpolation order is bin 506 first, then bin 504.

Once the correct combination of bin and layer factors for an interconnect primitive has been calculated, two other factors are used to further identify an interconnect primitive: lba width (width of the present wire segment), and spacing (distance between the present wire segment and its nearest parallel neighbor on the same conductor layer). Within each combination of bin and layer factors, capacitance values for the different interconnect primitive types are grouped into tables based on different width and spacing values. Note that the capacitance values stored represent the data points on curves relating the coupling capacitance values to width and spacing. A piecewise linear analysis of the curves produces the individual data values that are stored in the IC model library. As with bin factors, if specific values for width or spacing are not present in the library, interpolations between values specified by existing width and spacing values are used.

The last parameters used to identify an interconnect primitive are its type and its location relative to the present wire segment (measured in terms of bins). In the present embodiment, the following interconnect primitive types are used:

1. Nearest parallel neighbor in the same conductor layer, which represents the effects of the entire neighbor wire. The coupling capacitance to this interconnect primitive is labeled $C_c$.

2. Top plates of polygons in conductor layers below the present wire segment, or bottom plates of polygons in conductor layers above the present wire segment. These interconnect primitives are further broken down according to bins. For the structure illustrated in FIG. 5, top plate 509 would be broken down into three interconnect primitives (since the plate extends into bins 504, 505 and 506). The coupling capacitances to each of these interconnect primitives is labeled $C_g$.

3. Polygon faces that are parallel to the signal direction of the present wire segment, and that aye on different conductor layers than the conductor layer of the present wire segment. Faces are further broken down into those faces which face toward the present wire segment and those which face away from the present wire segment. In FIG. 5, face 507 is a 'toward face' and face 508 is an 'away face'. The coupling capacitances to these interconnect primitives are labeled $C_{ft}$ for 'toward faces' and $C_{fa}$ for 'away faces'.

Figure 6:
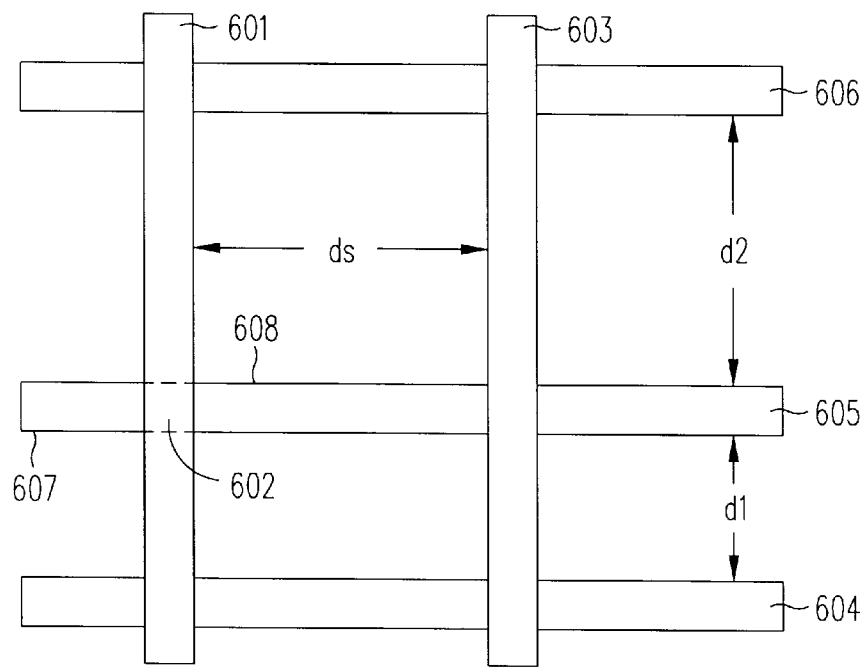
FIG. 6 illustrates a typical configuration for estimating the edge capacitance $C_e$.

4. Polygon faces that are perpendicular to the signal direction of the present wire segment (also called 'edges') and that are on different conductor layers from the conductor layer of the present wire segment. As with the interconnect primitive of coupling capacitance $C_g$, edges are further broken down according to bin. For example, in FIG. 5, the edge face 502a is divided into three interconnect primitives (since the plate extends into bins 504, 505 and 506). There is one additional factor used to identify the edge interconnect primitives—distance from the edge to the nearest parallel edge in the same conductor layer. Coupling capacitances to edge interconnect primitives are labeled $C_e$. FIG. 6 illustrates the factors which affect the edge capacitance $C_e$. FIG. 6 shows a present wire 601, which is spaced by a spacing $d_s$ from a parallel wire 603 in the same conductor layer as 601. Conductors 601 and 603 are formed above a neighboring conductor layer which includes conductors 604–606. The edge capacitance $C_e$ between the present wire segment in change area 602 and an edge 607 of conductor 605 depends upon the distance $d_l$ between conductors 604 and 605 and the spacing $d_s$ between conductors 601 and 603, but is reasonably independent of the width of conductor 605, the other edge 608 of conductor 605, of the distance d2 (which is greater than $d_l$) between conductors 605 and 606 on the opposite side of edge 607.

The curves of edge capacitance $C_e$ versus distance $d_l$, parameterized by the spacing $d_s$, are roughly the same shape. Thus, sample values at various distance are provided for a given reference spacing (thus, forming a "piecewise" linear curve). The curve for edge capacitance $C_e$ can then be reconstructed at runtime, given the spacings $d_s$. The edge capacitance for each edge of interest at any neighboring spacing $d_l$ can then be read from the reconstructed curve.

5. Substrate. Columbus assumes that there is a blanket ground plane below all structures. The substrate interconnect primitive is not divided into bins. Capacitance to this ground plane primitive is labeled $C_{sub}$.

Since neighbor vias are always partially shielded, and their contributions to the capacitance of the present wire segment are typically insignificant, as compared to the contributions of conductors the vias themselves connect, the present embodiment currently ignores neighbor vias. Vias that are part of the present wire segment also do not contribute a significant amount of capacitance to their surrounding neighbors. It does, however, contribute a significant amount of resistance. Therefore, the capacitance effects of vias as part of the present wire are ignored, but their resistance effects are included.

The above detailed description is provided to illustrate specific embodiments of the present invention and is not intended to be limiting the scope of the present invention. Numerous modifications and variations are possible within the scope of the present invention. The present invention is defined by the following claims.

We claim:

1. A system for extracting parasitic impedances from an integrated circuit layout, comprising:
   a database including values of physical parameters characterizing conductor and dielectric layers fabricated in a fabrication process;
   an interconnect primitive library organized according to a set of interconnect primitives, such that an interconnect structure fabricated under said fabrication process includes a component which maps into one of said interconnect primitives, said interconnect primitive library including, for each of said interconnect primitive, parameterized data of parasitic impedances, based on said values of said physical parameters; and
   a network extraction tool, said network extraction tool (i) analyzing structures within a predetermined distance in conductor layers of said integrated circuit in vicinities along a signal path of said integrated circuit, and (ii) mapping components of said structures to said interconnect primitives of said interconnect primitive library to provide an electrical network model of said signal path, based on said mapping and said parameterized data.

2. A system as in claim 1, wherein each interconnect primitive represents a capacitance coupling between a component of a structure in a selected conductor layer and a component of a structure in said signal path.

3. A system as in claim 2, wherein said structure in said signal path is in said selected conductor layer.

4. A system as in claim 3, wherein parasitic impedances of said interconnect primitive are adjusted for shielding effects arising from conductor layers other than said conductor layer of said signal path.

5. A system as in claim 3, wherein said capacitance coupling is characterized by a dimension of said component of said structure in said signal path and the distance separating said component of said structure in said signal path and the nearest structure thereto in said selected conductor layer.

6. A system as in claim 2, wherein said selected conductor layer is a substrate conductor layer.

7. A system as in claim 6, wherein said capacitance coupling is characterized by a dimension of said component of said structure in said signal path and the distance separating said component of said structure in said signal path and the nearest structure thereto in said selected conductor layer.

8. A system as in claim 2, wherein said structure in said signal path is in a different conductor layer than said selected conductor layer.

9. A system as in claim 8, wherein said interconnect primitive is further identified according to bins, each bin representing a predetermined range of distances from said component of said structure in said signal path.

10. A system as in claim 9, wherein said predetermined range of distances is process-specific and wherein said bins are characterized by a dimension of said component of said structure in said signal path.

11. A system as in claim 9, wherein said network extraction tool estimates said coupling capacitance by interpolating between interconnect primitives of neighboring bins.

12. A system as in claim 11, wherein said interpolating step includes using a function which diminishes with distance more rapidly than linearly.

13. A system as in claim 9, wherein said network extraction tool estimates said capacitance coupling taking into consideration the extent to which said structure in said selected conductor layer is present in each bin.

14. A system as in claim 8, wherein a selected surface of said structure in said selected conductor layer has a major extent in a direction orthogonal to said signal path.

15. A system as in claim 8, wherein said component of said structure in said selected conductor layer includes an edge thereof.

16. A system as in claim 15, wherein said capacitance coupling is characterized by a distance between said component in said selected conductor layer and its nearest neighboring structure in said selected conductor layer.

17. A system as in claim 8, wherein said component of said structure in said selected conductor layer is a surface oriented towards said component of said structure in said signal path.

18. A system as in claim 8, wherein said component of said structure in said selected conductor layer comprises a surface oriented away from said component of said structure in said signal path.

19. A system as in claim 8, wherein said interconnect primitive is characterized by a dimension of said component of said structure in said signal path.

20. A system as in claim 8, wherein said interconnect primitive is characterized by a spacing between said component of said structure in said signal path and the nearest structure thereto in the same conductor layer as said structure in said signal path.

21. A system as in claim 2, wherein said network extraction tool provides a capacitor in said electrical network model to represent said interconnect primitive.

22. A system as in claim 1, wherein said network extraction tool divides said structures into change areas, each change area representing a change in dimension in one of said structures.

23. A system as in claim 1, wherein said network extractor tool divides said signal path into a right portion and a left portion along a direction of signal propagation in said signal path, said network extraction tool analyzing structures in said right portion independently of structures in said left portion.

24. A system as in claim 1, wherein said network extraction tool analyzes coupling between a structure in a conductor layer of said signal path and a structure in a selected conductor layer other than said conductor layer of said signal path.

25. A system as in claim 24, wherein said network extraction tool selects a said selected conductor layer one at a time from a plurality of conductor layers in increasing order of a distance from said structure in said conductor layer of said signal path, taking into account shielding effects of conductor layers already selected.

26. A system as in claim 25, wherein said network extraction tool separately takes into account (i) shielding effects arising from capacitance coupling between said structure in said conductor layer of said signal path and structures in conductor layers on the same side of said selected conductor layer, and (ii) shielding effects arising from capacitance coupling between said structure in said conductor layer of said signal path and structures in conductor layers on opposite sides of said selected conductor layer.

27. A system as in claim 1, wherein each interconnect primitive is identified, in part, in said interconnect primitive library by a conductor layer.

28. A system as in claim 1, wherein said structures include vias, and wherein said network extraction tool provides in said electrical network model a resistor to represent each of said vias.

29. A system as in claim 1, further comprising an interconnect primitive library building tool, said interconnect library building tool assembling said interconnect primitive library using said values of said physical parameters and an electric field distribution solver.

30. A system as in claim 1, wherein said physical parameters include resistivity for each conductor layer in said fabrication process.

31. A system as in claim 1, wherein said physical parameters include a resistance for a via.

32. A system as in claim 1, wherein said network extraction tool traces said signal path along polygons in a conductor layer of said signal path.

33. A system as in claim 1, wherein said network extraction tool is configurable to trace said signal path up to terminals of transistors of said integrated circuit.

34. A system as in claim 1, wherein said network extraction tool is configurable to trace said signal path up to a pin of a macro cell of said integrated circuit.

35. A system as in claim 1, wherein said network extraction tool provides in said electrical network model, for each structure in a selected type of structures in said signal path, a "pi" network to represent the parasitic impedances of said structure.

36. A system as in claim 1, wherein said network extraction tool provides in said electrical network model, for each structure of a selected type of structure in said signal path, a three-terminal network to represent the parasitic impedance of said structure.

37. A system as in claim 1, wherein said network extraction tool provides said electrical network model in a format suitable for use as an input file to a specified circuit simulation tool.

38. A method for extracting parasitic impedances from an integrated circuit layout, comprising:
 including in a database values of physical parameters characterizing conductor and dielectric layers fabricated in a fabrication process;
 organizing an interconnect primitive library according to a set of interconnect primitives, such that an interconnect structure fabricated under said fabrication process includes a component which maps into one of said interconnect primitives, said interconnect primitive library including, for each of said interconnect primitive, parameterized data of parasitic impedances, based on said values of said physical parameters; and
 providing a network extraction tool, said network extraction tool (i) analyzing structures within a predetermined distance in conductor layers of said integrated circuit in vicinities along a signal path of said integrated circuit, and (ii) mapping components of said structures to said interconnect primitives of said interconnect primitive library to provide an electrical network model of said signal path, based on said mapping and said parameterized data.

39. A method as in claim 38, wherein each interconnect primitive represents a capacitance coupling between a component of a structure in one of said conductor layers and a component of a structure in said signal path.

40. A method as in claim 39, wherein said structure in said signal path is in said selected conductor layer.

41. A method as in claim 40, wherein parasitic impedances of said interconnect primitive are adjusted for shielding effects arising from conductor layers other than said conductor layer of said signal path.

42. A method as in claim 40, wherein said capacitance coupling is characterized by a dimension of said component of said structure in said signal path and the distance separating said component of said structure in said signal path and the nearest structure thereto in said selected conductor layer.

43. A method as in claim 39, wherein said selected conductor layer is a substrate conductor layer.

44. A method as in claim 43, wherein said capacitance coupling is characterized by a dimension of said component of said structure in said signal path and the distance separating said component of said structure in said signal path and the nearest structure thereto in said selected conductor layer.

45. A method as in claim 39, wherein said structure in said signal path is in a different conductor layer than said selected conductor layer.

46. A method as in claim 45, wherein said interconnect primitive is further identified according to bins, each bin representing a predetermined range of distances from said component of said structure in said signal path.

47. A method as in claim 46, wherein said predetermined range of distances is process-specific and wherein said bins are characterized by a dimension of said component of said structure in said signal path.

48. A method as in claim 46, wherein said network extraction tool estimates said coupling capacitance by interpolating between interconnect primitives of neighboring bins.

49. A method as in claim 48, wherein said interpolating step includes using a function which diminishes with distance more rapidly than linearly.

50. A method as in claim 46, wherein said network extraction tool estimates said capacitance coupling taking into consideration the extent to which said structure in said selected conductor layer is present in each bin.

51. A method as in claim 45, wherein a selected surface of said structure in said selected conductor layer has a major extent in a direction orthogonal to said signal path.

52. A method as in claim 45, wherein said component of said structure in said selected conductor layer includes an edge thereof.

53. A method as in claim 52, wherein said capacitance coupling is characterized by a distance between said component in said selected conductor layer and its nearest neighboring structure in said selected conductor layer.

54. A method as in claim 45, wherein said component of said structure in said selected conductor layer is a surface oriented towards said component of said structure in said signal path.

55. A method as in claim 45, wherein said component of said structure in said selected conductor layer comprises a surface oriented away from said component of said structure in said signal path.

56. A method as in claim 45, wherein said interconnect primitive is characterized by a dimension of said component of said structure in said signal path.

57. A method as in claim 45, wherein said interconnect primitive is characterized by a spacing between said component of said structure in said signal path and the nearest structure thereto in the same conductor layer as said structure in said signal path.

58. A method as in claim 39, wherein said network extraction tool provides a capacitor in said electrical network model to represent said interconnect primitive.

59. A method as in claim 38, wherein said network extraction tool divides said structures into change areas, each change area representing a change in dimension in one of said structures.

60. A method as in claim 38, wherein said network extractor tool divides said signal path into a right portion and a left portion along a direction of signal propagation in said signal path, said network extraction tool analyzing structures in said right portion independently of structures in said left portion.

61. A method as in claim 38, wherein said network extraction tool analyzes coupling between a structure in a conductor layer of said signal path and a structure in a selected conductor layer other than said conductor layer of said signal path.

62. A method as in claim 61, wherein said network extraction tool selects a said selected conductor layer one at a time from a plurality of conductor layers in increasing order of a distance from said structure in said conductor layer of said signal path, taking into account shielding effects of conductor layers already selected.

63. A method as in claim 62, wherein said network extraction tool separately takes into account (i) shielding effects arising from capacitance coupling between said structure in said conductor layer of said signal path and structures in conductor layers on the same side of said selected conductor layer, and (ii) shielding effects arising from capacitance coupling between said structure in said conductor layer of said signal path and structures in conductor layers on opposite sides of said selected conductor layer.

64. A method as in claim 38, wherein each interconnect primitive is identified, in part, in said interconnect primitive library by a conductor layer.

65. A method as in claim 38, wherein said structures include vias, and wherein said network extraction tool provides in said electrical network model a resistor to represent each of said vias.

66. A method as in claim 38, further comprising an interconnect primitive library building tool, said interconnect library building tool assembling said interconnect primitive library using said values of said physical parameters and an electric field distribution solver.

67. A method as in claim 38, wherein said physical parameters include resistivity for each conductor layer in said fabrication process.

68. A method as in claim 38, wherein said physical parameters include a resistance for a via.

69. A method as in claim 38, wherein said network extraction tool traces said signal path along polygons in a conductor layer of said signal path.

70. A method as in claim 38, wherein said network extraction tool is configurable to trace said signal path up to terminals of transistors of said integrated circuit.

71. A method as in claim 38, wherein said network extraction tool is configurable to trace said signal path up to a pin of a macro cell of said integrated circuit.

72. A method as in claim 38, wherein said network extraction tool provides in said electrical network model, for each structure in a selected type of structure in said signal path, a "pi" network to represent the parasitic impedances of said structure.

73. A method as in claim 38, wherein said network extraction tool provides in said electrical network model, for each structure of a selected type of structure in said signal path, a three-terminal network to represent the parasitic impedance of said structure.

74. A method as in claim 38, wherein said network extraction tool provides said electrical network model in a format suitable for use as an input file to a specified circuit simulation tool.

* * * * *